United States Patent
Sicard

(10) Patent No.: US 9,584,046 B2
(45) Date of Patent: Feb. 28, 2017

(54) GATE DRIVE CIRCUIT AND A METHOD FOR CONTROLLING A POWER TRANSISTOR

(71) Applicant: Thierry Sicard, Auzeville Tolosane (FR)

(72) Inventor: Thierry Sicard, Auzeville Tolosane (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/899,529

(22) PCT Filed: Jul. 4, 2013

(86) PCT No.: PCT/IB2013/001767
§ 371 (c)(1),
(2) Date: Dec. 17, 2015

(87) PCT Pub. No.: WO2015/001374
PCT Pub. Date: Jan. 8, 2015

(65) Prior Publication Data
US 2016/0149515 A1 May 26, 2016

(51) Int. Cl.
*H02M 7/538* (2007.01)
*H02M 7/5387* (2007.01)
(Continued)

(52) U.S. Cl.
CPC ....... *H02M 7/53871* (2013.01); *H02M 7/537* (2013.01); *H03K 3/037* (2013.01);
(Continued)

(58) Field of Classification Search
CPC .......... H02M 1/08; H02M 1/09; H02M 1/084; H02M 1/088; H02M 1/096
See application file for complete search history.

(56) References Cited

U.S. PATENT DOCUMENTS 6,094,087 A 7/2000 He et al.
6,160,441 A 12/2000 Stratakos et al.
(Continued)

FOREIGN PATENT DOCUMENTS

EP 1596496 11/2005
JP 11108986 4/1999
(Continued)

OTHER PUBLICATIONS

International Search Report and Written Opinion correlating to PCT/IB2013/001767 issued on Apr. 14, 2014.

*Primary Examiner* — Timothy J Dole
*Assistant Examiner* — Yusef Ahmed

(57) ABSTRACT

A gate drive circuit to drive a gate terminal of a power transistor. The gate drive circuit includes a first capacitor, a first switch, a measurement circuit and a reference source to generate a reference voltage. The first capacitor has a first terminal electrically coupled to the gate terminal of the power transistor. The first switch is arranged between a second terminal of the first capacitor and a first predetermined voltage. The measurement circuit is used to measure a differential voltage across the first capacitor. The gate drive circuit is configured to pre-charge the first capacitor to obtain a second predetermined voltage across the first capacitor. The gate drive circuit is further configured to arrange the first switch in an on state to turn on the power transistor and to electrically couple the first predetermined voltage to the second terminal of the first capacitor. The first capacitor is initially pre-charged at the second predetermined voltage.

16 Claims, 4 Drawing Sheets

(51) Int. Cl.
*H03K 17/06* (2006.01)
*H03K 17/689* (2006.01)
*H02M 7/537* (2006.01)
*H03K 3/037* (2006.01)
*H03K 5/24* (2006.01)
*H03K 17/567* (2006.01)

(52) U.S. Cl.
CPC ............... *H03K 5/24* (2013.01); *H03K 17/06* (2013.01); *H03K 17/567* (2013.01); *H03K 17/689* (2013.01)

(56) References Cited

U.S. PATENT DOCUMENTS

| | | | | |
|---|---|---|---|---|
| 8,063,857 B2* | 11/2011 | Kohno | ................. | G09G 3/3233 |
| | | | | 315/169.3 |
| 2004/0178407 A1* | 9/2004 | Lin | ................. | G09G 3/325 |
| | | | | 257/40 |
| 2006/0012549 A1* | 1/2006 | Ikeda | ................. | G09G 3/3233 |
| | | | | 345/76 |
| 2006/0238947 A1* | 10/2006 | Krotsch | ................. | H03K 17/063 |
| | | | | 361/100 |
| 2007/0046587 A1* | 3/2007 | Takahara | ................. | G09G 3/3241 |
| | | | | 345/76 |
| 2007/0103001 A1 | 5/2007 | Chiozzi et al. | | |
| 2007/0126667 A1* | 6/2007 | Nakamura | ................. | G09G 3/3233 |
| | | | | 345/76 |
| 2008/0068059 A1* | 3/2008 | Cortigiani | ................. | H03K 17/163 |
| | | | | 327/170 |
| 2009/0102504 A1* | 4/2009 | Voigtlaender | ................. | G01R 31/2621 |
| | | | | 324/762.09 |
| 2015/0084946 A1* | 3/2015 | Shim | ................. | G09G 3/3258 |
| | | | | 345/212 |
| 2015/0288356 A1* | 10/2015 | Sicard | ................. | H03K 17/567 |
| | | | | 327/382 |
| 2015/0381167 A1* | 12/2015 | Sicard | ................. | H03K 17/687 |
| | | | | 318/139 |
| 2016/0149569 A1* | 5/2016 | Sicard | ................. | H03K 17/06 |
| | | | | 327/109 |
| 2016/0248420 A1* | 8/2016 | Sicard | ................. | H03K 17/0412 |

FOREIGN PATENT DOCUMENTS

| | | |
|---|---|---|
| JP | 2000311495 | 11/2000 |
| JP | 2010200560 | 9/2010 |
| WO | 2007137268 A2 | 11/2007 |

* cited by examiner

GATE DRIVE CIRCUIT AND A METHOD FOR CONTROLLING A POWER TRANSISTOR

FIELD OF THE INVENTION

This invention relates to a gate drive circuit used to drive a power transistor. The invention further relates to a power inverter including the gate drive circuit and the power transistor. The invention further relates to a power module that include the power inverter and to a method of controlling the power transistor.

BACKGROUND OF THE INVENTION

Motor control may have a wide range of applications. The applications may include, among others, electrical motors for electric vehicles but also electrical motors for residential washing machines, fans, hand-held power tools, industrial motor drives, etc.

Induction or asynchronous motors are typically used in the above mentioned applications. Induction or asynchronous motors are AC motors in which a current is induced by electromagnetic induction in a rotating winding by a magnetic field generated in a static winding. Induction or asynchronous motors do not require sliding electric contacts electrically connecting the rotating winding to the static winding, thereby simplifying construction and improving reliability of the induction or asynchronous motors.

Availability of affordable, reliable power transistors (e.g., power MOSFETs and IGBTs) and modules capable to drive such induction or asynchronous motors are an important design goal in the above mentioned applications.

Typically, a gate drive circuit controls a gate of the power transistor. IGB transistors are reliable power transistors which typically have a gate charge of several microcoulombs. In order to quickly turn-on an IGB transistor with low losses a current of several amperes has to be applied to control the gate. Switching losses of IGB transistors depend on how rapidly a gate charge providing full conductivity may be fed or removed from the component gate. The gate voltage of an IGB transistor in a full conducting state is typically of the order of +15V. A gate voltage lower than +15 V may lead to excessive conduction losses and a gate voltage higher than +15 V may lead to a destruction of the IGB transistor. The IGB transistor has typically an internal gate contact resistance through which a voltage drop may be generated. Thus the gate drive circuit must provide a sufficient high output voltage to allow current to be generated through the internal gate contact resistance.

Forcing +15 V at the gate terminal of the IGB transistor may be a straightforward solution in order to guarantee a proper gate voltage to reach the full conducting state. The internal gate contact resistance and the internal gate capacitance provide an RC constant determining the speed of switching of the IGB transistor. After approximately four RC constant times, the voltage at the internal gate terminal reaches +15 V. For most applications this switching speed may not be acceptable.

EP1596496A1 provides a gate drive circuit that speed up the turning on of an IGB transistor. The gate drive circuit is provided with a specific boost capacitor added in series with the gate contact resistance. During switching off the IGB transistor the boost capacitor is charged to a voltage limited by a zener diode placed in parallel with the boost capacitor. During switching on the IGB transistor, the gate makes use of the previously stored charge in the boost capacitor and on a voltage built across the gate contact resistance to increase very rapidly the gate charge. Although EP1596496A1 provides an effective solution to speed up the turning on of an IGBT, one of the problem with this solution is that the charge across the boost capacitor may not be controlled very accurately. The only way to control the charge across the boost capacitor, according to EP1596496A1, is by correct dimensioning of the boost capacitance in relation to the gate charge of the IGBT to be controlled. Only in this case the energy stored in the boost capacitor may exhaust when the gate voltage of the IGBT has risen to +15 V.

SUMMARY OF THE INVENTION

The present invention provides a gate drive circuit used to drive a gate terminal of a power transistor, a power inverter, a power module and a method of controlling the power transistor.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1:
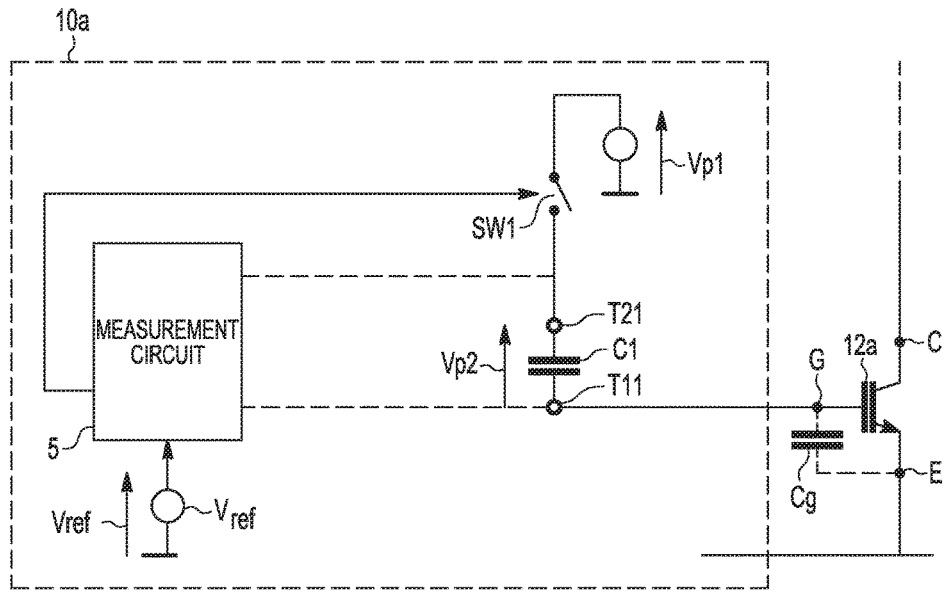
FIG. 1 schematically shows an example of an embodiment of a gate drive circuit.

FIG. 1 schematically shows an example of an embodiment of a gate drive circuit 10a. The gate drive circuit 10a is used to drive a gate terminal G of a power transistor 12a. The power transistor 12a of FIG. 1 is an IGBT (Isolated Gate Bipolar Transistor) with a gate terminal G, an emitter terminal E and a collector terminal C. Alternatively, the power transistor 12a may be a FET transistor and in particular an N-channel FET transistor in which case the emitter terminal E is a source terminal and the collector terminal C is a drain terminal. The gate drive circuit 10a includes a first capacitor C1, a first switch SW1, a measurement circuit 5 and a reference source 6 to generate a reference voltage Vref. A first terminal T11 of the first capacitor C1 is electrically coupled to the gate terminal G of the power transistor 12a. The first switch SW1 is arranged between a second terminal T21 of the first capacitor C1 and a first predetermined voltage Vp1 to electrically couple, when on, the second terminal T21 of the first capacitor C1 to the first predetermined voltage Vp1. The measurement circuit 5 is used to measure a differential voltage across the first capacitor C1. The reference voltage Vref may be used by the measurement circuit 5 to measure the differential voltage across the first capacitor C1. The gate drive circuit 10a is configured to pre-charge the first capacitor C1 in order to obtain a second predetermined voltage Vp2 across the first capacitor C1. The gate drive circuit 10a is further configured to arrange the first switch SW1 in an on state to turn on the power transistor 12a. When the power transistor 12a is turned on, the power transistor 12a is in a conducting state, i.e. a large current is allowed to flow with low losses in a main conducting path formed by the collector terminal C and the emitter terminal E of the power transistor 12a. When the first switch SW1 is arranged in an on state, the first predetermined voltage Vp1 is electrically coupled to the second terminal T21 of the first capacitor C1. Since the first capacitor C1 is pre-charged at the second predetermined voltage Vp2, the gate terminal G of the power transistor 12a is at a voltage correspondent to the first predetermined voltage Vp1 minus the second predetermined voltage Vp2. As mentioned in the background, if the power transistor 12a is an IGBT, the voltage needed at the gate terminal G in order to turn on the IGBT may be approximately +15 V. A voltage higher than +15 V may damage the IGBT, a voltage lower than +15 V may increase losses of the IGBT during the conducting state. When the first switch SW1 is turned on, a sufficient voltage is generated at the gate terminal G to turn on the IGBT. Furthermore a transfer of charges starts to flow from the first capacitor C1 to the gate terminal G of the IGBT in order to bring the IGBT in the conducting state. The measurement circuit 5 monitors the differential voltage across the first capacitor C1 during the turning on of the power transistor 12a. When the transfer of charges to the gate terminal G is such that a change of the differential voltage across the first capacitor C1 is equal to the reference voltage Vref, the measurement circuit 5 is configured to arrange the first switch SW1 in an off-state. In this way the transfer of charges from the first capacitor C1 to the gate terminal G of the power transistor 12a is stopped and the power transistor 12a (e.g. the IGBT) is brought in the conducting state. In other words in order to turn on the IGBT of FIG. 1 a gate capacitor Cg needs to be charged. The gate capacitor Cg of the IGBT is charged via a transfer of charges from the first capacitor C1 during an on state of the first switch SW1 that forces the first predetermined voltage Vp1 to the second terminal T21 of the first capacitor C1. When the transfer of charges from the first capacitor C1 corresponds to a differential voltage across the first capacitor C1 equivalent to the reference voltage Vref, the first switch SW1 is arranged in an off state and the IGBT is in the conducting state. In this way the transfer of charges from the first capacitor C1 to the gate capacitor Cg of the IGBT is accurately controlled and an accurate voltage (e.g. +15 V for IGBTs) may be generated at the gate terminal G of the IGBT. The reference voltage Vref is thus a measure of the transfer of charges from the first capacitor C1 to the gate capacitor Cg of the IGBT. The IGBT of FIG. 1 is typically a discrete component with predetermined design parameters. Therefore the gate capacitor Cg of the IGBT is also typically a known predetermined design parameter. The first capacitor C1 may be for example a surface mounted device (i.e. an SMD) external to a portion of the gate drive circuit 10a which may be integrated on a chip. The first capacitor C1 may have a capacitance value of 10 uF which may be too large to be integrated on chip. The portion of the gate drive circuit 10a which may be integrated on the chip may include for example the measurement circuit 5 and the first switch SW5. The first capacitor C1 is thus also a known design component. The differential voltage across the first capacitor C generates a charge equal to:

$$Q = \Delta V \cdot C1,$$

where Q is the charge generated and $\Delta V$ is the differential voltage across the first capacitor C1. When the differential voltage $\Delta V$ across the first capacitor C1 is equal to the reference voltage Vref, the first switch SW1 is arranged in an off position and an equivalent amount of charges Q is transferred to the gate capacitor Cg:

$$Q = (\Delta V_1) \cdot Cg,$$

where Q is the charge transferred to the gate capacitor Cg and $\Delta V_1$ is the differential voltage across the gate capacitor Cg which is the voltage across the gate terminal G and the emitter terminal E of the power transistor 12a. By knowing the first capacitor C1 and the gate capacitor Cg and by controlling the differential voltage $\Delta V$ across the first capacitor C1 in the way so far described, the differential voltage $\Delta V_1$ across the gate capacitor Cg (i.e. the gate-emitter voltage of the IGBT) is precisely determined. The differential voltage $\Delta V_1$ across the gate capacitor Cg may be for example precisely +15 V as required for IGBTs in the conducting state.

In another example according to the invention the second predetermined voltage Vp2 may be dependent on the reference voltage. As said, the measurement circuit 5 may uses the reference voltage Vref to measure the differential voltage across the first capacitor C1. If the second predetermined voltage Vp2 is dependent on the reference voltage Vref, a change of the differential voltage across the first capacitor C1 with respect to the second predetermined voltage Vp2 at which the first capacitor C1 is pre-charged, by an amount equivalent to the reference voltage Vref may be detected directly in relation with the reference voltage Vref. In this way the measurement circuit 5 may be simplified. The measurement circuit 5 may be for example a differential comparator comparing a voltage to be measured, i.e. the differential voltage across the first capacitor C1, versus the reference voltage Vref.

In another example according to the invention the second predetermined voltage Vp2 may be a linear combination of a boost voltage Vboost and the reference voltage Vref. The boost voltage Vboost may be for example 10 V. The reference voltage Vref may have a value of 230 mV. The second predetermined voltage Vp2 may be a difference between the boost voltage Vboost and the reference voltage Vref (e.g. 10 V minus 230 mV). The second predetermined voltage Vp2 may be thus a linear combination of a large boost voltage Vboost and a small reference voltage Vref. The large boost voltage Vboost at which the first capacitor C1 may be charged may ensure that a large voltage may be generated at the gate terminal G of the IGBT during the turn on of the IGBT. The generated large voltage is, as previously said, the difference between the first predetermined voltage Vp1 and the second predetermined voltage Vp2 when the first switch SW1 is in on state, i.e. during turning on the IGBT. In the given example the second predetermined voltage Vp2 may be approximately 10 V, i.e. 10 V minus 230 mV, while the first predetermined voltage Vp1 may be 30V. As a consequence a voltage of approximately 20 V may be generated at the gate terminal G of the IGBT. The IGBT may have an internal contact resistance through which the transfer of charges, i.e. a charge current, from the first capacitor C1 to the gate capacitor Cg may occur. The voltage of 20 V generated at the gate terminal G of the IGBT may ensure that sufficient current may be generated in the internal contact resistance of the IGBT to drive the IGBT in the conducting state. The IGBT may be a large power transistor in which a large collector current may flow in the conducting state. The large collector current that may flow in the IGBT may be in a range of hundreds of Ampere. The large collector current may be for example 400 A. The emitter terminal E of the IGBT may be connected to a reference potential GND (e.g. typically a ground 0 V potential). Interconnection providing the connection from the emitter terminal E to the reference potential GND may have a parasitic inductance. This parasitic inductance is known in the art as a stray inductance. The stray inductance may be very small, in the order of 1 nH. However the large and rapid collector current change during turning on the IGBT, i.e. the large $dI_c/dt$, may cause a large voltage drop across the stray inductance. For a stray inductance of 1 nH, the voltage drop across the stray inductance may be for example 5 V. This large voltage drop may leave little margin for the internal gate emitter voltage to be applied to the IGBT to turn-on the IGBT. The boost voltage Vboost at which the first capacitor C1 is approximately pre-charged may increase the margin for the internal gate to emitter voltage needed to turn on the IGBT. In this way the internal gate emitter voltage needed to turn on the IGBT may be reached so that the IGBT is fully turned on, out of saturation and with minimal power losses, i.e. with a minimal collector to emitter voltage drop for a given switching current. Further to that the boost voltage Vboost at which the first capacitor C1 is approximately pre-charged in combination with the accurate control of the amount of charge transferred to the gate capacitor Cg may speed up the turn on of the IGBT. In fact the internal gate resistance in conjunction with the gate capacitor Cg form an RC circuit which is supplied by the voltage generated at the gate terminal G. By accurately controlling the differential voltage across the first capacitor C1 an accurate control may be achieved of how long a voltage larger than +15 V may need to be applied at the gate terminal G to ensure a fast turn-on of the IGBT. In other words a controlled overshoot (with reference to the nominal needed voltage of +15 V) may be provided at the gate terminal G to ensure a fast turn on of the IGBT. The controlled overshoot ensures optimal switching speed performance of the IGBT and prevents a damage of the IGBT. Compared to prior art document EP1596496A1, the solution proposed in FIG. 1 shows thus better control of the differential voltage across the first capacitor C1 and thus a better control of the transfer of charges from the first capacitor C1 to the gate capacitor Cg.

In another practical example according to the invention the measurement circuit 5 may be configured to arrange the first switch SW1 in an on state when the differential voltage across the first capacitor C1 has reached the boost voltage Vboost. In the example above described, the second predetermined voltage Vp2 is the difference between the boost voltage Vboost and the reference voltage Vref. For the same example the measurement circuit 5 may be configured to open the first switch SW1 whenever the differential voltage across the first capacitor C1 has increased by the reference voltage Vref, i.e. whenever the differential voltage across the first capacitor C1 has reached a boost voltage Vboost value. In this practical example the pre-charge of the first capacitor C1 may be simplified by for example pre-charging the first terminal T11 of the first capacitor C1 to the reference voltage Vref and by pre-charging the second terminal T21 of the first capacitor C1 to the boost voltage Vboost.

Figure 2:
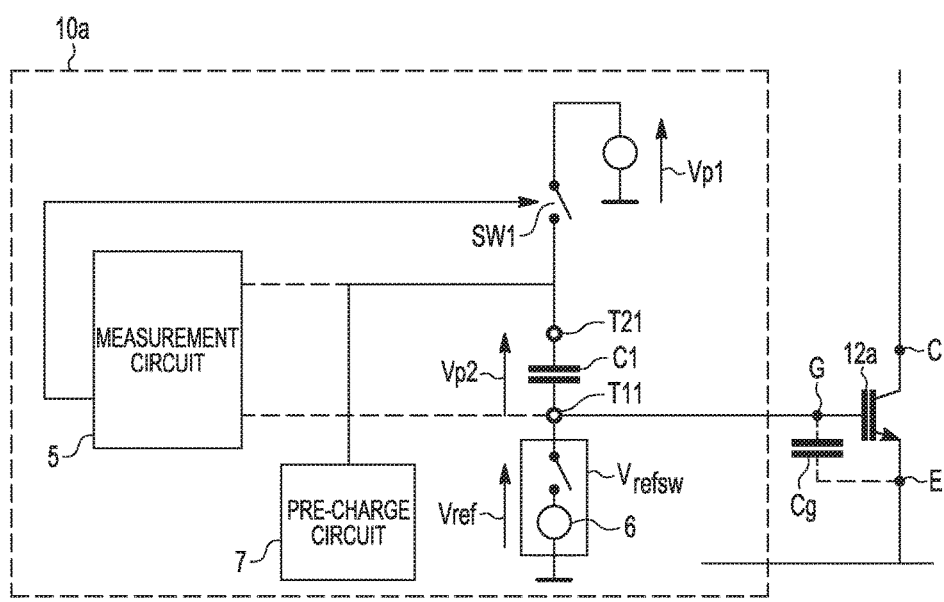
FIG. 2 schematically shows another example of an embodiment of a gate drive circuit.

FIG. 2 schematically shows another example of a practical embodiment of the gate drive circuit 10a. The gate drive circuit 10a of FIG. 2 further includes a switchable reference source Vrefsw. The switchable reference source Vrefsw includes the reference source 6. The switchable reference source Vrefsw is arranged to be electrically coupled to the first terminal T11 of the first capacitor C1. The switchable reference source Vrefsw is configured to electrically connect the reference source 6 to the first terminal T11 of the first capacitor C1 when the first capacitor C1 is pre-charged to the second predetermined voltage Vp2. The switchable reference source Vrefsw is further configured to electrically disconnect the reference source 6 from the first terminal T11 of the first capacitor C1 after that the first capacitor C1 has been pre-charged to the second predetermined voltage Vp2. The gate drive circuit 10a of FIG. 2 further includes a pre-charge circuit 7 to generate the boost voltage Vboost at the second terminal T21 of the first capacitor C1. In this practical embodiment the first capacitor C1 maybe pre-charged to the boost voltage Vboost minus the reference voltage Vref. Further to that, the reference source 6 that generates the reference voltage Vref may be switched off from the first terminal T11 of the first capacitor C1 such that the gate terminal G of the power transistor 12a may be pulled up to bring the power transistor 12a in the conducting state or pulled down (e.g. to a negative voltage) to bring the power transistor 12a in an off state. The switchable reference source Vrefsw may be used by the measurement circuit 5 so that the reference source 6 that generates the reference voltage Vref may be connected to the measurement circuit 5 during the measurement of the differential voltage across the first capacitor C1. The switchable reference source Vrefsw may include a regulator arranged in a loop to generate the reference voltage Vref. The switchable reference source Vrefsw may include additional circuitry to clamp the voltage at the gate terminal G to a desired voltage value after that the desired voltage has been reached during the turning on or off the power transistor 12a.

Figure 3:
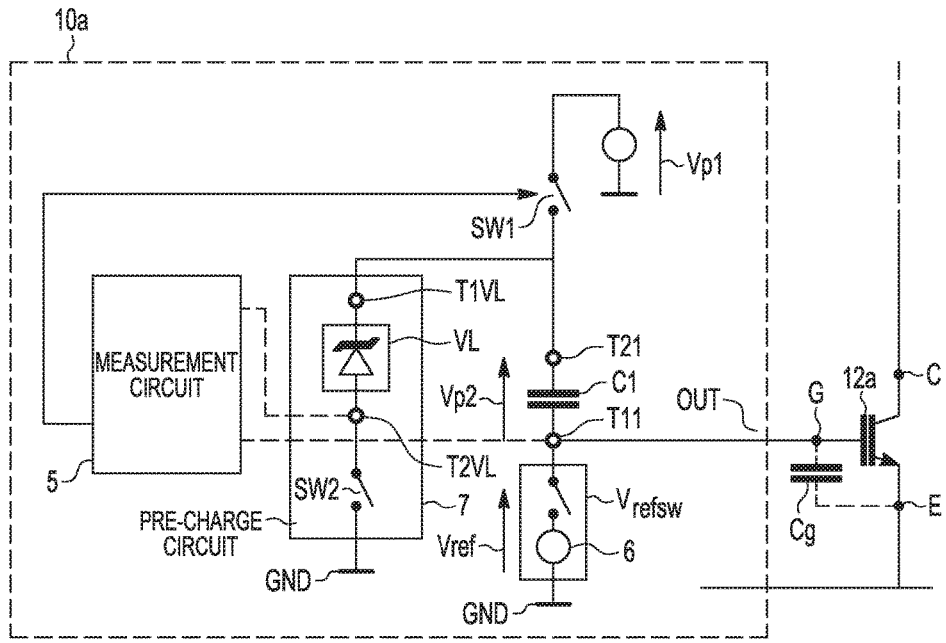
FIG. 3 schematically shows a further example of an embodiment of a gate drive circuit.

FIG. 3 schematically shows another example of a practical embodiment of the gate drive circuit 10a. FIG. 3 is similar to FIG. 2. FIG. 3 shows additional components included in the pre-charge circuit 7. The pre-charge circuit 7 includes a voltage limiter VL and a second switch SW2. The voltage limiter VL is electrically coupled to the second terminal T21 of the first capacitor C1. The voltage limiter VL has a first terminal T1VL electrically coupled to the second terminal T21 of the first capacitor C1 and a second terminal T2VL electrically coupled to a reference potential GND by means of the second switch SW2. The gate drive circuit 10a is configured to arrange the second switch SW2 in an on state during the pre-charge of the first capacitor C1 and to arrange the second switch SW2 in an off state after the pre-charge of the first capacitor C1. The voltage limiter VL may be for example a zener diode with a cathode connected to the second terminal T21 of the first capacitor C1 and with an anode connected to the second switch SW2. The zener diode may be for example a 10 V zener diode and the voltage at the second terminal T21 of the first capacitor C1 may be clamped to 10 V. The pre-charge of the first capacitor C1 may occur by means of the first switch SW1 and the first predetermined voltage Vp1. The first switch SW1 may be for example an N-channel FET that during the pre-charge of the first capacitor C1 may be configured as a current source to provide current to pre-charge the first capacitor C1. Alternatively the first capacitor C1 may be pre-charged by means of another current source which may be connected for example between the first terminal T11 of the first capacitor C1 and the reference potential GND. The current source used to pre-charge the first capacitor C1 may be for example part of the pre-charge circuit 7. Alternatively the current source may be part of the switchable reference source Vrefsw.

Figure 4:
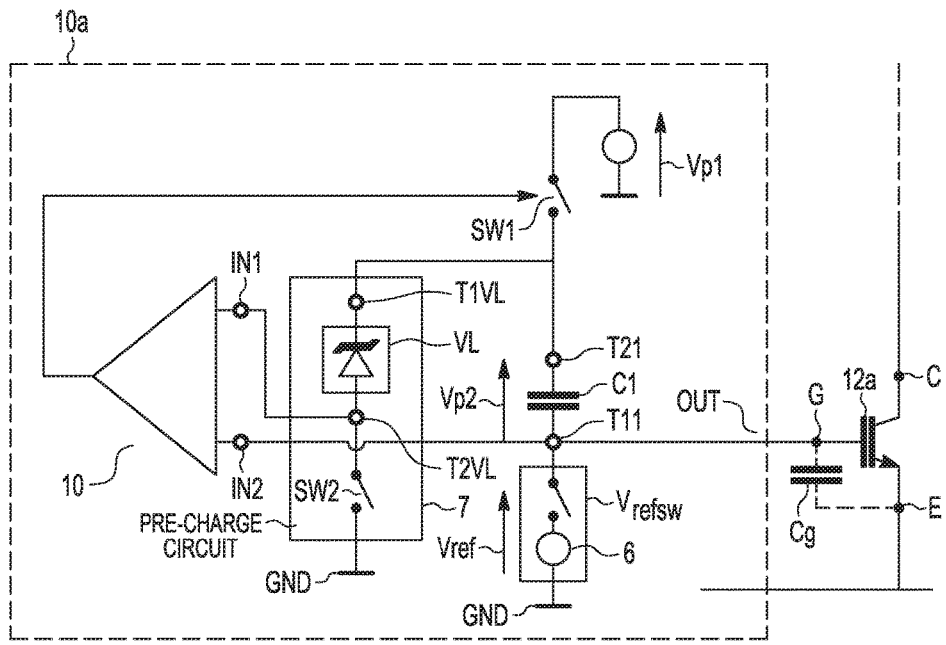
FIG. 4 schematically shows another example of an embodiment of a gate drive circuit.

FIG. 4 schematically shows another example of a practical embodiment according to the invention. FIG. 4 is similar to FIG. 3. In FIG. 4 the measurement circuit 5 of FIG. 3 is a comparator 10. The comparator 10 has a first input IN1 electrically coupled to the second terminal T2VL of the voltage limiter VL. The comparator 10 has a second input IN2 electrically coupled to the first terminal T11 of the first capacitor C1. The comparator 10 may detect a differential voltage across the first capacitor C1 equal to the reference voltage Vref. In fact during the pre-charge of the first capacitor C1, the second switch SW2 maybe in an on state and the reference source 6 may be electrically connected to the first terminal T11 of the first capacitor C1. Therefore during the pre-charge of the first capacitor C1 the second terminal T21 of the first capacitor C1 may be clamped to a voltage across the voltage limiter VL (e.g. the boost voltage Vboost) and the first terminal T11 of the first capacitor C1 may be clamped to the reference voltage Vref. The second predetermined voltage Vp2 across the first capacitor C1 may be thus the difference between the voltage across the voltage limiter VL and the reference voltage Vref. During turning on the power transistor 12a, the first switch SW1 is in an on state, the second switch SW2 may be in an off state and the switchable reference voltage Vrefsw may be configured to electrically disconnect the reference source 6 from the first terminal T11 of the first capacitor C1. During turning on the power transistor 12a the differential voltage across the first capacitor C1 may increase by the reference voltage Vref, in which case the differential voltage across the first capacitor C1 may be the voltage across the voltage limiter VL. As a consequence the voltage at the second terminal T2VL of the voltage limiter VL may also increase by the reference voltage Vref and the voltage difference between the first terminal IN1 of the comparator 10 and the second terminal IN2 of the comparator 10 may reach 0 V. When the comparator 10 detects a zero voltage difference between the first terminal IN1 and the second terminal IN2, i.e. V(IN1)−V(IN2)=0, the comparator 10 may arrange the first switch SW1 in an off state to electrically disconnect the first predetermined voltage Vp1 from the second terminal T21 of the first capacitor C1.

The comparator 10 may be any type of suitable comparator to detect a voltage difference between two voltages with respect to the reference potential GND (e.g. 0 V ground potential).

Figure 5:
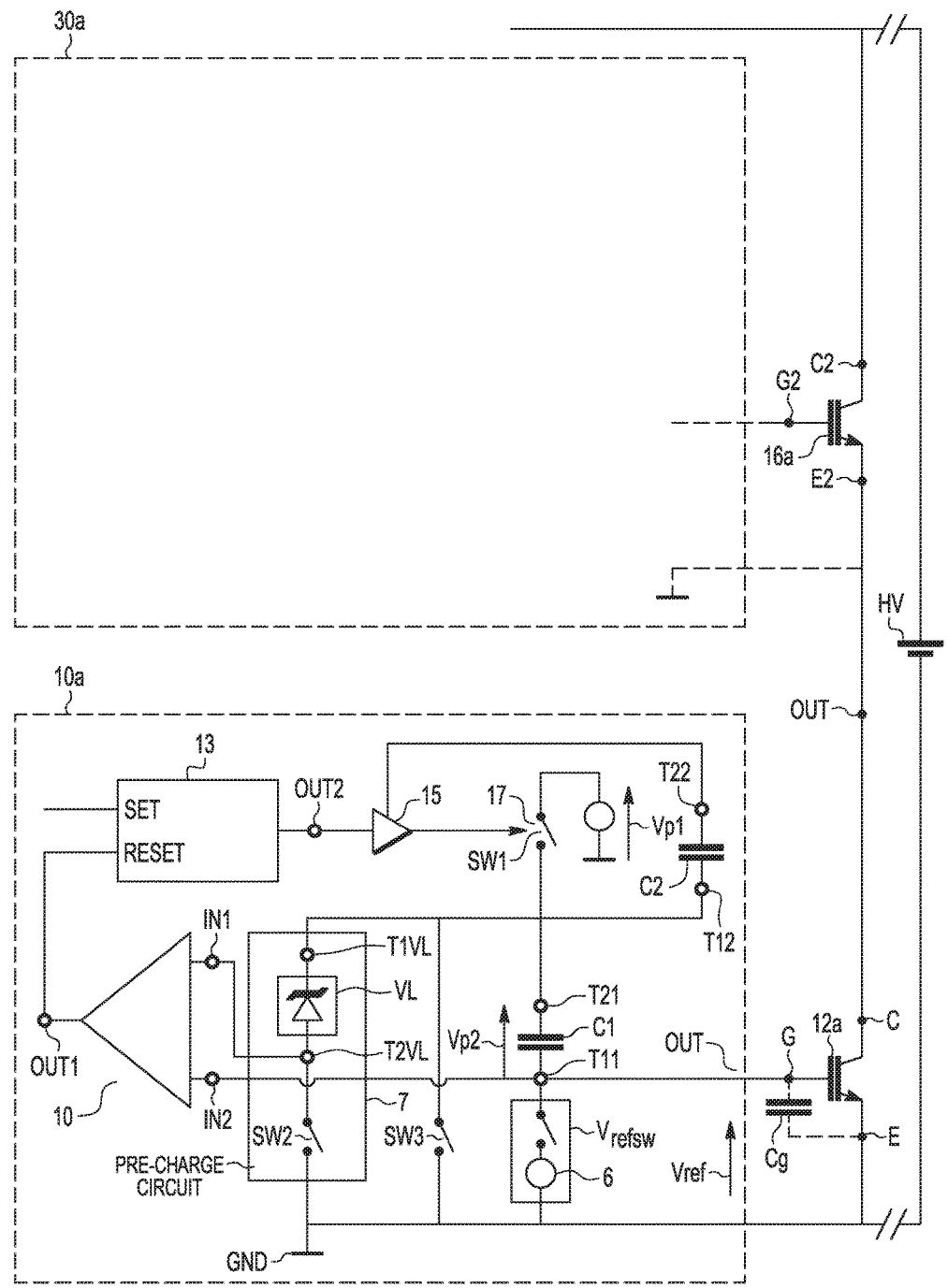
FIG. 5 schematically shows a power inverter including a gate drive circuit and two power transistors.

FIG. 5 schematically shows a power inverter. The power inverter shown in FIG. 5 includes the gate drive circuit 10a so far described and the power transistor 12a. The power transistor 12a of FIG. 5 is an IGBT. The power inverter further includes a further power transistor 16a which is also an IGBT. A gate terminal G2 of the further power transistor 16a is electrically coupled to a further gate drive circuit 30a. The further gate drive circuit 30a is drawn with an empty box because the further gate drive circuit 30a is equivalent to the gate drive circuit 10a and components having the same function are for simplicity not re-drawn. The power transistor 12a at low side is connected with the further power transistor 16a at high side in a power inverter topology. An emitter terminal E2 of the further power transistor 16a is electrically coupled to the collector terminal C of the power transistor 12a at low side. A collector terminal C2 of the further power transistor 16a is electrically coupled to a supply voltage HV. The voltage supply HV powers the power inverter topology, thereby powering the low side power transistor 12a and the high side power transistor 16a. The voltage supply HV may be a high voltage supply derived for example from a battery. In electric vehicles batteries, the high voltage supply may be in the order of 300 V at a full charge. When the battery of the electric vehicles is discharged the high voltage supply may drop to 200 V. An output OUT of the power inverter is used to drive a load (not shown in FIG. 5). The power inverter may be configured to have alternatively the low side power transistor 12a turned on or the high side power transistor 16a turned pn. The low side power transistor 12a and the high side power transistor 16a may not be simultaneously turned on during driving the load. In this way a short circuit directly connecting the supply voltage HV to the reference ground GND may be avoided. It should be noted the output OUT of the power inverter may change of several hundred volts, from the reference potential GND to the voltage supply HV. As indicated in FIG. 5 by the dashed line drawn from the output OUT of the power inverter to the gate drive circuit 30a, the output OUT of the power inverter is a reference potential used by the further gate drive circuit 30a.

The gate drive circuit 10a of FIG. 5 includes additionally to what already shown in FIG. 4: a set-reset flip flop 13, a second capacitor C2 and a third switch SW3. The set-reset flip flop 13 has an output OUT2 electrically coupled to the first switch SW1 to control the first switch SW1. An output OUT1 of the comparator 10 is electrically coupled to a reset input Reset of the set-reset flip flop 13. The reset input Reset of the set-reset flip flop 13 is configured to receive a signal from the output OUT1 of the comparator 10 to arrange the first switch SW1 in an off state after that the first capacitor C1 has been charged to a differential voltage equivalent to the reference voltage Vref. The set-reset flip flop 13 has a set input Set. The set input Set of the set-reset flip flop 13 is configured to receive a signal to arrange the first switch SW1 in an on state during turning on the power transistor 12a. The first switch SW1 may be controlled by means of a buffer 15. Alternatively the first switch SW1 may be controlled without the buffer 15.

The second capacitor C2 has a first terminal T12 electrically coupled to the second terminal T21 of the first capacitor C1. The second capacitor C2 has a second terminal T22 electrically coupled to a control terminal 17 of the first switch SW1. The second terminal T22 of the second capacitor C2 may be coupled to the control terminal 17 by means of the buffer 15. The second terminal T22 of the second capacitor C2 may be used to supply the buffer 15 to fully turn on the first switch SW1. To explain further, the first switch SW1 may be a NMOS transistor that may be used to drive the gate terminal G of the power transistor 12a. NMOS transistors are typically preferred to PMOS transistors in gate drive circuits because they may be smaller for the same current capabilities. However, using NMOS transistors in place of PMOS transistors means that a voltage higher than the power supply voltage of the gate drive circuit 10a may be needed to fully turn on the NMOS transistor, thereby minimizing an on resistance of the NMOS transistor in its main conductive path and thus consequently minimizing significant heat losses. The first predetermined voltage Vp1 may be the power supply voltage of the gate drive circuit 10a. Thus the first predetermined voltage Vp1 is higher than the second predetermined voltage Vp2. The second capacitor C2 may be used during turning on the power transistor 12a to lift the voltage at the second terminal T22 of the second capacitor C2 with respect to the reference potential GND above the first predetermined voltage Vp1 to fully turn-on the first switch SW1. The second capacitor C2 may thus function during turning on the power transistor 12a as a so called Bootstraap capacitor. The second capacitor C2 may have a capacitance of 100 nF.

The third switch SW3 of FIG. 5 is arranged between the second terminal T21 of the first capacitor C1 and the reference potential GND to electrically coupled when on the second terminal T21 of the of the first capacitor C1 to the reference potential GND. The third switch SW3 maybe an N-channel FET. The third switch SW3 is used to turn off the power transistor 12a and to discharge the first capacitor C1. The gate capacitor Cg and the first capacitor C1 may be discharged at the same time when the third switch SW3 is arranged in an on state. The third switch SW3 may be used in combination with the first capacitor C1 to turn off the IGBT of FIG. 5 with a single power supply voltage (e.g. the first predetermined voltage Vp1). In fact it is acknowledged in the art that an IGBT needs a negative voltage at the gate terminal G in order to be tuned-off. When the first capacitor C1 is previously pre-charged to a positive second predetermined voltage Vp2 (e.g. 10 V minus 250 mV as in the example previously described) and the third switch SW3 is successively arranged in an on state, the gate terminal G of the IGBT is at a negative voltage equal to a negative value of the second predetermined voltage Vp2 (e.g. −10 V plus 250 mV by way of the same example previously described). In other words the third switch SW3 in combination with the second capacitor C2 may allow turning off the IGBT by using the single power supply voltage Vp1.

A further pair of power inverters may be arranged in a three phase half-bridge or full-bridge topology. Three phase half-bridge or full-bridge topologies may be used to drive a three phase induction or asynchronous motor as described in the background. The three phase induction or asynchronous motor may be a power train of for example an electric or hybrid vehicle.

In another example according to the invention a portion or portions of the gate drive circuit 10a and/or of the gate drive circuits 30a of the power inverter shown in FIG. 5 maybe integrated in a single integrated circuit. The portions integrated in the single integrated circuit may include all components so far described with except of the first capacitor C1 and of the second capacitor C2. The first capacitor C1 and the second capacitor C2 may be placed outside the single integrated circuit. The first capacitor C1 and the second capacitor C2 may have a very large capacitance difficult to integrate on chip. The first capacitor C1 and the second capacitor C2 may for example be SMD (surface-mounted device) placed in the power module.

Figure 6:
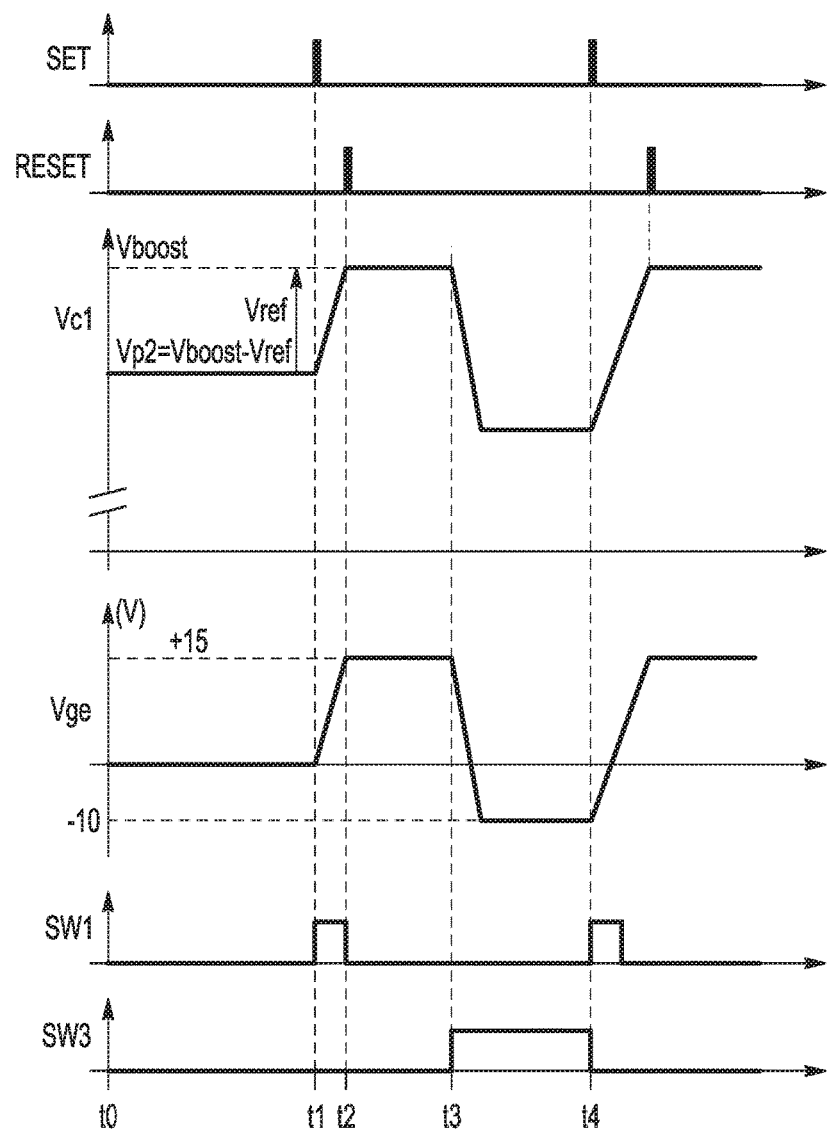
FIG. 6 schematically shows a time diagram for a method of controlling a power transistor.

FIG. 6 shows a time diagram of a method to control a power transistor 12a. The time diagram provided is relative to a method of controlling an IGBT with the gate drive circuit 10a described through the FIGS. 1 to 5. FIG. 6 indicates different time steps. Each time step indicates a change of state of the first switch SW1 and of the third switch SW3. The method will be described with reference to these changes of state. The top two graphs describe the functionality of the set-reset flip flop 13. The third graph from the top shows the differential voltage Vc1 across the first capacitor C1. The fourth graph from the top shows the gate-emitter voltage across the IGBT. The two graphs at the bottom of FIG. 6 show how the first switch SW1 and the third switch SW3 are controlled to turn on and off the IGBT.

The method includes: 1) providing a first switch SW1 between a first capacitor C1 and a first predetermined voltage Vp1 wherein a first terminal T11 of the first capacitor C1 is connected to a gate terminal G of the power transistor (12a), 2) pre-charging between time t0 and time t1 the first capacitor C1 to obtain a second predetermined voltage across the first capacitor (C1), 3) arranging at time t1 the first switch SW1 in an on state to electrically couple the first predetermined voltage Vp1 to the a second terminal T21 of the first capacitor C1, 4) measuring between time t1 and time t2 a differential voltage across the first capacitor C1 by means of a measuring circuit 5, 5) arranging at time t2 the first switch SW1 in an off state if the differential voltage across the first capacitor C1 has changed with respect to the second predetermined voltage Vp2 by a reference voltage Vref. In the example given in FIG. 6 the second predetermined voltage Vp2 is equal to the boost voltage Vboost minus the reference voltage Vref. The differential voltage across the first capacitor C1 increases to the boost voltage Vboost when the first capacitor C1 is charged during turning on the IGBT.

The method so far described may include after 5) arranging at time t2 the third switch SW3 in an off state, 6) arranging at time t3 a third switch SW3 in an on state to electrically couple the second terminal T21 of the first capacitor C1 to a reference potential GND and 7) arranging at time t4 the third switch SW3 in an off state and the first switch SW1 in an on state to re-charge the first capacitor C1.

The method may optionally include before 6) arranging at time t3 a third switch SW3 in an on state to electrically couple the second terminal T21 of the first capacitor C1 to a reference potential GND, 5b) clamping between time t2 and time t3 the voltage at the gate terminal G of the IGBT to +15 V (i.e. the desired turn-on voltage of the IGBT) and optionally after 6) arranging at time t3 a third switch SW3 in an on state to electrically couple the second terminal T21 of the first capacitor C1 to a reference potential GND, 8) clamping the voltage at the gate terminal G of the IGBT to −10 V (i.e. the desired turn-off voltage of the IGBT). After time t3 the first capacitor C1 is discharged to a voltage lower than the second predetermined voltage Vp2. Before time t1 the first capacitor C1 may be pre-charged and after time t1 the IGBT may be operational and be turned on and off with a voltage at the gate terminal G of +15 V and −10 V as required.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections between electrically coupled devices may be any type of connection suitable to transfer signals from or to the respective nodes, units or devices, for example via intermediate devices. Accordingly, unless implied or stated otherwise the connections may for example be direct connections or indirect connections. For example in FIGS. 1 to 4 a dashed line is drawn on the collector terminal C of the power transistor 12a to indicate that there may be other components electrically coupling the collector terminal C of the power transistor 12a. These other components are further specified, as way of examples, in the practical embodiments of FIG. 5.

Because the circuits implementing the present invention are, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention. For example the switchable voltage reference Vrefsw and the pre-charge circuit 7 of FIGS. 3 to 5 may be implemented in many alternative ways known to those skilled in the art.

Although the invention has been described with respect to specific polarity of potentials, skilled artisans appreciated that polarities of potentials may be reversed.

It is to be understood that FIGS. 1 to 5 show some architectures of the present invention. The architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in the embodiments of FIGS. 1 to 5, the illustrated elements of the gate drive circuit 10a or portions of the illustrated elements of the gate drive circuit 10a may be located on a single integrated circuit or within a same device. Alternatively, the illustrated elements of the gate drive circuit 10a or portions of the illustrated elements of the gate drive circuit 10a may include any number of separate integrated circuits or separate devices interconnected with each other.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or an limits any particular claim containing such introduced claim element to inventions containing only one such element, even when the same claim includes the introductory phrases one or more or at least one and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A gate drive circuit for a power transistor, the gate drive circuit comprising:
   a first capacitor, a first terminal of the first capacitor being electrically coupled to a gate terminal of the power transistor,
   a first switch being arranged between a second terminal of the first capacitor and a first predetermined voltage,
   a measurement circuit for measuring a differential voltage across the first capacitor,
   a reference source for generating a reference voltage,
   the gate drive circuit being configured to pre-charge the first capacitor to obtain a second predetermined voltage across the first capacitor, the gate drive circuit being further configured to arrange the first switch in an on state for turning on the power transistor to electrically couple the first predetermined voltage to the second terminal of the first capacitor being pre-charged at the second predetermined voltage, the measurement circuit being configured to arrange the first switch in an off state when the differential voltage across the first capacitor has changed with respect to the second predetermined voltage by the reference voltage.

2. The gate drive circuit as claimed in claim 1 wherein the second predetermined voltage is dependent on the reference voltage.

3. The gate drive circuit as claimed in claim 2 wherein the second predetermined voltage is a linear combination of a boost voltage and the reference voltage.

4. The gate drive circuit as claimed in claim 3 wherein the measurement circuit is configured to arrange the first switch in an off state when the differential voltage across the first capacitor has reached the boost voltage.

5. The gate drive circuit according to claim 2, the gate drive circuit further comprising a switchable reference source and a pre-charge circuit, the switchable reference source comprising the reference source, the switchable reference source being arranged to be electrically coupled to the first terminal of the first capacitor, the switchable reference source being configured i) to electrically connect the reference source to the first terminal of the first capacitor during the pre-charge of the first capacitor, and ii) to electrically disconnect the reference source from the first terminal of the first capacitor after the pre-charge of the first capacitor, and the pre-charge circuit being configured to generate a boost voltage at the second terminal of the first capacitor during the pre-charge of the first capacitor.

6. The gate drive circuit according to claim 5 wherein the pre-charge circuit comprises a voltage limiter and a second switch, a first terminal of the voltage limiter being electrically coupled to the second terminal of the first capacitor, a second terminal of the voltage limiter being electrically coupled to a reference potential by means of the second switch, the gate driver circuit being configured i) to arrange the second switch in an on state during the pre-charge of the first capacitor and ii) to arrange the second switch in an off state after the pre-charge of the capacitor.

7. The gate drive circuit according to claim 6 wherein the measurement circuit is a comparator, a first input of the comparator being electrically coupled to the second terminal of the voltage limiter, a second input of the comparator being electrically coupled to the first terminal of the first capacitor.

8. The gate drive circuit according to claim 7 further comprising a set-reset flip flop, an output of the set-reset flip flop being electrically coupled to the first switch for controlling the first switch, a reset input of the set-reset flip flop being electrically coupled to an output of the comparator, the reset input being configured to receive a signal from the comparator (10) for arranging the first switch in an off state, a set input of the set-reset flip flop being configured to receive a signal for arranging the first switch in an on state.

9. The gate drive circuit according to claim 6 wherein the gate drive circuit further comprises a third switch being arranged between the second terminal of the first capacitor and the reference potential to electrically couple the second terminal to the reference potential when the third switch is on.

10. The gate drive circuit according to claim 9 wherein the first switch, the second switch and the third switch are N channel field effect transistors.

11. The gate drive circuit according to claim 1 further comprising a second capacitor, a first terminal of the second capacitor being electrically coupled to the second terminal of the first capacitor, a second terminal of the second capacitor being electrically coupled to a control terminal of the first switch.

12. The gate drive circuit as claimed in claim 1 wherein the first predetermined voltage (Vp1) is larger than the second predetermined voltage.

13. The gate drive circuit according to claim 1 wherein the power transistor is an IGBT.

14. A power inverter comprising:
a first capacitor, a first terminal of the first capacitor-being electrically coupled to a gate terminal of a power transistor,
a first switch being arranged between a second terminal of the first capacitor and a first predetermined voltage,
a measurement circuit for measuring a differential voltage across the first capacitor,
a reference source for generating a reference voltage,
a gate drive circuit being configured to pre-charge the first capacitor to obtain a second predetermined voltage across the first capacitor, the gate drive circuit being further configured to arrange the first switch in an on state for turning on the power transistor to electrically couple the first predetermined voltage to the second terminal of the first capacitor being pre-charged at the second predetermined voltage, the measurement circuit being configured to arrange the first switch in an off state when the differential voltage across the first capacitor has changed with respect to the second predetermined voltage by the reference voltage, the power inverter further comprising a further power transistor, a gate terminal of the further power transistor electrically coupled to a further gate drive circuit, an emitter or source terminal of the further power transistor being electrically coupled to the collector terminal of the power transistor and a collector or drain terminal of the further power transistor being electrically coupled to a supply voltage.

15. A method for controlling a power transistor, the method comprising:
providing a first switch between a first capacitor and a first predetermined voltage, a first terminal of the first capacitor connected to a gate terminal of the power transistor,
pre-charging the first capacitor to obtain a second predetermined voltage across the first capacitor,
arranging the first switch in an on state to electrically couple the first predetermined voltage to the a second terminal of the first capacitor,
measuring a differential voltage across the first capacitor by means of a measuring circuit,
arranging the first switch in an off state if the differential voltage across the first capacitor has changed with respect to the second predetermined voltage by a reference voltage.

16. The method of claim 15 further comprising after arranging the first switch in an off state:
arranging a third switch in an on state to electrically couple the second terminal of the first capacitor to a reference potential,
arranging the third switch in an off state and the first switch in an on state to re-charge the first capacitor.

* * * * *